United States Patent [19]

Wolfe et al.

[11] Patent Number: 4,983,253
[45] Date of Patent: Jan. 8, 1991

[54] MAGNETICALLY ENHANCED RIE PROCESS AND APPARATUS

[75] Inventors: John C. Wolfe; Ahmed M. El-Masry; Fu-On Fong, all of Houston, Tex.

[73] Assignee: University of Houston-University Park, Houston, Tex.

[21] Appl. No.: 199,945

[22] Filed: May 27, 1988

[51] Int. Cl.$^5$ .................. H01L 21/306; B44C 1/22; C03C 15/00; C03C 25/06

[52] U.S. Cl. ................................ 156/643; 156/646; 156/657; 156/659.1; 156/662; 156/345; 204/192.37; 204/298; 204/298.37

[58] Field of Search ............ 156/643, 646, 657, 659.1, 156/662, 345; 204/192.32, 192.35, 192.37, 298; 252/79.1; 118/728, 50.1, 623; 427/38, 39; 437/233

[56] References Cited

U.S. PATENT DOCUMENTS

| | | | |
|---|---|---|---|
| 4,233,109 | 11/1980 | Nishizawa | 156/643 |
| 4,298,443 | 11/1981 | Maydan | 204/192 |
| 4,422,896 | 12/1983 | Class et al. | 156/643 |
| 4,492,610 | 1/1985 | Okano et al. | 156/643 |
| 4,581,118 | 4/1986 | Class et al. | 156/345 X |
| 4,624,767 | 11/1986 | Obinata | 156/345 X |
| 4,744,861 | 5/1988 | Matsunaga et al. | 437/192 X |
| 4,842,683 | 6/1989 | Cheng et al. | 156/345 |
| 4,842,707 | 6/1989 | Kinoshita | 204/298 |

FOREIGN PATENT DOCUMENTS 0159025  10/1982  Japan ................................ 156/643

OTHER PUBLICATIONS

D. L. Flamm, P. L. Cowan, and J. A. Golovchenko, "Etching and Film Formation in CF3Br Plasmas; Some Qualitative Observations and Their General Implications", J. of Vacuum Science Tech., 1341–1347.

J. P. McVittie and C. Gonzalez, Proceedings of the 5th Symposium on Plasma Processing, p. 552 (1984).

G. C. Schwartz and P. M. Schaible, "Reactive Ion Etching of Silicon," J. of Vaccuum Science Tech., 16, 410–413 (1979).

C. J. Mogab and H. J. Levinstein, "Anisotropic Plamsa Etching of Polysilicon," J. of Vacuum Science Tech. 17(3), 721–730.

L. D. Jackel, R. E. Howard, E. L. Hu, D. M. Tennant, and P. Grabbe, "50 n-m Silicon Structures Fabricated with Trilevel Electron Beam Resist and Reactive-Ion Etching," Applied Physics Letters 268–270.

S. Matsuo, "Selective Etching of Si Relative to SiO2 Without Undercutting by CBrF3 Plasma," Applied Physics Letters 36(9), 768–770 (1980).

D. L. Flamm, "Mechanisms of Radical Production in Radiofrequency Discharges of CF3Br, and Certain Other Plasma Etchants; Spectrum of Transient Species," J. of Applied Physics 51(11), 5688–5692 (1981).

L. M. Ephrath and R. S. Bennett, "Dry Etching Processes for Polysilicon and Polycide," Microcircuit Eng. '83, 389–396 (1983).

Kirk–Othmer, "Integrated Circuits, " Encyclopedia of Chemical Technology, vol. 13, pp. 637–645.

Primary Examiner—William A. Powell
Attorney, Agent, or Firm—Arnold, White & Durkee

[57] ABSTRACT

An etching process and apparatus employ a novel magnetic enhancement means and a substantially pure molecular bromine plasma in order to perform in a desired manner for a number of important applications requiring etching of single-crystal and polycrystalline silicon.

42 Claims, 4 Drawing Sheets

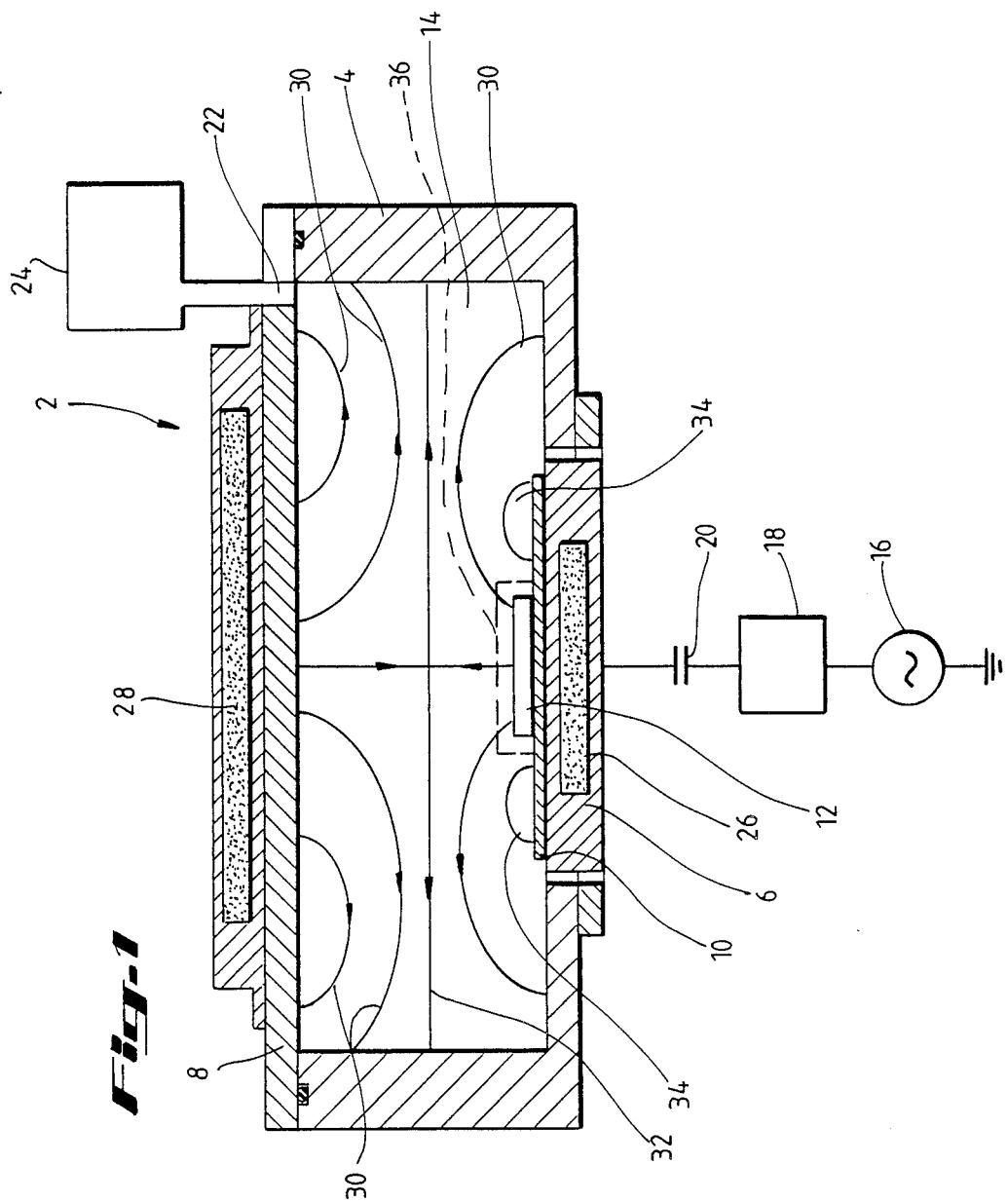

MAGNETICALLY ENHANCED RIE PROCESS AND APPARATUS

STATEMENT OF GOVERNMENT INTEREST

The government of the United States has certain rights in this invention pursuant to National Security Agency contract MDA-85-C-6069.

BACKGROUND OF THE INVENTION

The present invention relates to magnetically enhanced reactive ion etching (RIE) of substrates and, more particularly, to magnetically enhanced reactive ion etching of substrates of silicon wafers in bromine plasmas.

During fabrication of integrated circuits it is sometimes desirable to remove material from a wafer by etching processes. These etching processes can be characterized by their selectivity (i.e., ability to "attack" certain materials but not other materials) and by their anisotropy (i.e., ability to etch in one direction only, as opposed to undesired isotropic etching, in which material is etched in all directions at the same rate). Such etching processes can also be characterized by the spatial uniformity of the etch rate across the surface of the material to be etched.

Anisotropic etching of single-crystal and polycrystalline silicon with high selectivity to silicon dioxide has many important, recognized applications. One such application with respect to polycrystalline silicon (polysilicon) is in the area of metal-oxide-semiconductor field-effect transistor gate fabrication where oxides less than 10 nm thick must effectively stop an etch of up to 0.5 μm of polysilicon. Etching of single-crystal silicon using a silicon dioxide mask also has important applications in fabricating trenches for device isolation, trench memory cells for dynamic random access memory, and channeling and grid-support masks for ion-beam lithography.

Plasma etching of surfaces such as silicon wafers is well-established technology. Plasma etching involves a chemical reaction whereby material to be removed undergoes conversion to a volatile state in the presence of at least one chemically active species produced in a gas discharge. Reactive ion etching (RIE) processes combine the use of chemically active species with ion bombardment. In RIE processes, it is believed that ion bombardment results in damage to the surface, which is then more easily removed by the chemically active species. It should be noted that there are other explanations for the RIE mechanism as well, involving, for example, ion induced chemical reactions. Thus, in a basic sense, RIE processes constitute an attempt to strike a desired balance between purely chemical and purely physical processes. The former (e.g., dissolution) is highly selective but isotropic, while the latter (e.g., bombardment with high-energy ions) is inherently isotropic but less selective.

The desire for uniformity of etching has led to various refinements of plasma etching systems. Some such refined systems involve "tunnel" reactor designs having multiple gas inlets. Other such refined systems involve "planar" reactors in which substrates are positioned on a planar electrode. In such systems, wafers are directly in the plasma so that energetic species having high recombination rates may be used. The wafers are positioned normal to the rf field so that ion movement is both rapid and highly directional.

There is growing recognition of the importance of low-energy etching processes because high-energy etching can cause significant lattice damage to etched surfaces and oxide breakdown during gate fabrication. Furthermore, it is known that selectivity to oxide can be increased at low ion energies. Various approaches are available for achieving high etch rates at low voltages. The most commonly used approach is high-pressure "plasma" etching. Although designated a low voltage system, operating voltages in such systems well exceed 110-V. The two other approaches known to those skilled in the art are designated "magnetron" and "flexible diode" systems.

Etching of silicon with chlorine- and fluorine-based plasmas in RIE reactors is well-known and common. In both cases, selectivity to oxide has been typically found to be less than 20. Chlorine-based etching is anisotropic in the RIE mode except for very high doping concentrations, although undercutting has been detected in the plasma etching mode, even for lightly doped material. Fluorine-based etching is intrinsically isotropic and photoresist etch rates are high. Oxygen or polymer-forming gases have been added to fluorine-based etching systems to achieve anisotropic etching by suppressing side-wall erosion. Addition of polymer-forming gases tends to reduce photoresist etch rates. But, systems containing polymer-forming gases often require a large amount of maintenance and have relatively low resolution.

Other types of plasmas have been used as well, including $CF_3Br$. When $CF_3Br$ is used in RIE systems, highly anisotropic silicon profiles have been produced. However, undercutting has been detected in plasma etching of both doped and undoped polysilicon, with relatively poor oxide selectivity. Thus, $CF_3Br$ is not wholly satisfactory.

Notwithstanding the many permutations of systems in the prior art, these systems have various shortcomings. None, for example, combines anisotropy for all levels of doping (n+), low resist etching rates, ultra-low silicon dioxide etching rates, ultra-high resolution, and low maintenance requirements. In addition, many of the prior art systems involve the use of multiple-gas plasma systems. Others result in low selectivity, anisotropy or uniformity. Because every system lacks one or more of these features, none is especially suitable for producing silicon stencil masks, for etching VLSI polysilicon gates, or for accomplishing other important applications.

SUMMARY OF THE INVENTION

In a broad aspect, the present invention is directed to a novel apparatus for etching a substrate, preferably a silicon wafer. The reactor is magnetically enhanced so that a wafer to be processed can be placed in the interior of the discharge ring of a planar magnetron so that the ring surrounds the wafer. In another broad aspect, the invention includes an etching apparatus with a plasma which contains substantially pure molecular bromine vapor.

In a more specific aspect, the apparatus of the present invention includes a reactor having disposed therein a means for supporting the silicon wafer to be etched, a means for causing a discharge ring of a planar magnetron to arise within said reactor and to surround the wafer, a means for causing a plasma (preferably a molecular bromine plasma) to be generated within said reactor, and a means for causing ions within said plasma to etch the silicon to be etched. The apparatus also may include a wafer that is small enough to avoid touching the discharge ring.

In another specific aspect, the process of the present invention includes the steps of supplying power between an anode and a cathode, generating a plasma (preferably a molecular bromine plasma) within a reaction chamber, placing silicon to be etched in the vicinity of said cathode, etching said silicon by ions attracted from said plasma toward said cathode, and producing a discharge ring of a planar magnetron around the silicon. The process and apparatus of the present invention are capable of operating at low energy, having a preferred −85 to −105 V cathode bias and a more preferred cathode bias of −90 V.

Accordingly, certain aspects of the present invention possess an ideal combination of anisotropy, selectivity, etch rates, and etching uniformity so as to constitute a significant advance over the prior art. Aspects and advantages of the invention are also discussed in the article by A. M. El-Masry, F-0. Fong, J. C. Wolfe and J. N. Randall, entitled "Magnetically Enhanced Reactive Ion Etching of Silicon in Bromine Plasmas", J. Vac. Sci. Technol. B 6(1), Jan./Feb., 1988, pp. 257-262, which is herein incorporated by reference.

BRIEF DESCRIPTION OF THE DRAWINGS

FIG. 1 is a schematic diagram of a magnetically enhanced RIE system;

DETAILED DESCRIPTION OF THE INVENTION

Figure 3:
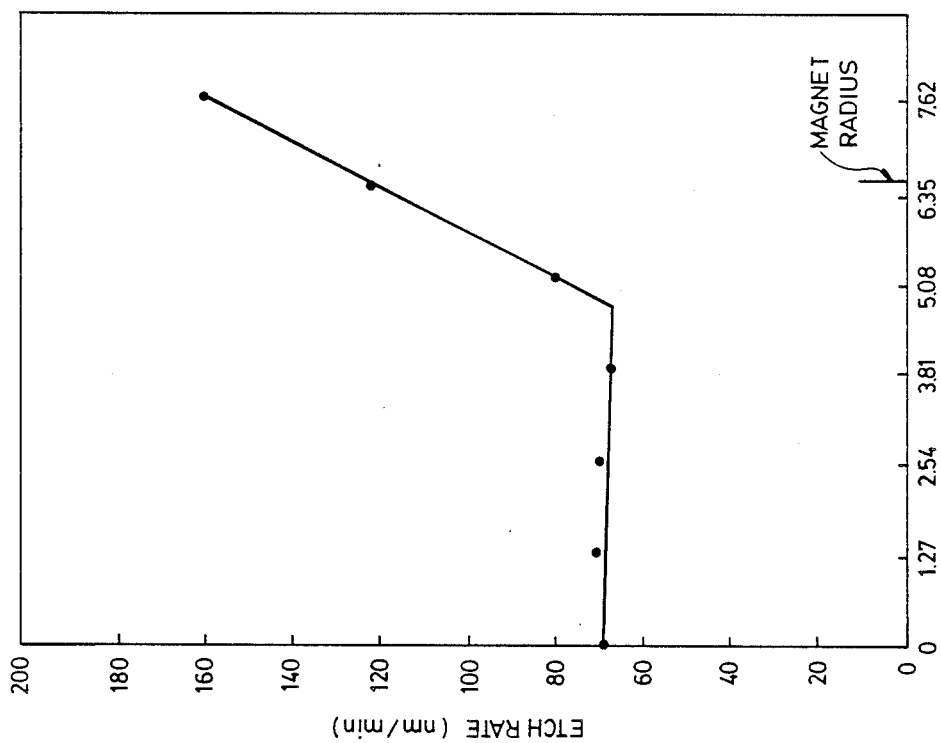
FIG. 3 shows radial etch distribution measured from the center of the etch platform for 5 Ω cm, P-doped, single-crystal silicon in a bromine plasma at 2 m Torr.

Referring now to the drawings wherein like or similar elements are designated with identical numerals throughout the several views, and wherein shown apparatuses are not necessarily drawn to scale, a preferred embodiment of the present invention, indicated generally as 2, is shown schematically in FIG. 1. Apparatus 2 is an RIE reactor having an aluminum reaction chamber 4 in which a cathode/etch platform 6 is disposed opposite to an anode 8. The cathode/etch platform 6 is substantially covered by a fused quartz plate 10 to prevent contamination from sample 10 by sputtered aluminum during operation of apparatus 2. For measurement purposes, the rim of cathode/etch platform 6 is exposed to help provide electrical contact with plasma 14 that is in chamber 4 during operation of apparatus 2. A radio frequency (rf) power source 16 is connected to cathode/etch platform 6 to provide application of rf power thereto through a matching network 18 and blocking capacitor 20.

Chamber 4 is adapted (by having, for example, inlet port 22) to allow introduction of the bromine therein. Apparatus 2 has means for introducing a reactive etchant gas, preferably comprising pure bromine, into reaction chamber 12. This means is indicated in FIG. 1 by block element 24. This means includes such elements as a glass ampoule containing bromine, a liquid nitrogen trap, and a diffusion pump system backing up the liquid nitrogen trap, a stainless-steel needle valve to control pressure without throttling the trap, and an ambient temperature water bath to stabilize the temperature of the ampoule. Because operation of each of the foregoing elements making up the means for introducing bromine into chamber 4 are conventional, and operation and interaction of each of them is well known to those skilled in the art, further details concerning them are not provided herein. It should be understood that other reactive etchant gases can be used in accordance with the invention besides pure bromine. Etchant gases CCl$_4$, CF$_3$Br, C$_2$F$_6$, O$_2$, Cl$_2$, CO, CF$_4$ have also been found to work adequately in accordance with the invention. Thus, generally speaking, both fluorine- and chlorine-based plasmas should also work within the scope of this invention.

One aspect of the invention involves a magnetically enhanced etching apparatus having a plasma which contains molecular bromine, i.e., Br$_2$. Molecular bromine helps provide many of the advantageous features of the invention, such as high selectivity to photoresist and silicon dioxide, anisotropy for heavily doped n-type silicon, and highly uniform etching. It has been discovered that any presence of CF$_3$ molecules would tend to reduce the effectiveness of the system and is generally to be avoided. Therefore, CF$_3$Br would present problems avoided by the present invention.

Molecular bromine vapor (hereinafter may be referred to as "bromine") is a particularly advantageous feature of the invention because it can be used alone, i.e., as a single-component plasma system. The preferred plasma is substantially pure molecular bromine. Although other gases may be introduced along with the bromine, too many reactive, non-inert impurities (such as CF$_3$Br or oxygen) may impair the effectiveness of the invention. For example, other gases may destroy the plasma's selectivity with respect to silicon dioxide. Preferably, the plasma contains at least 90 percent molecular bromine. This would be enough to offset most known contaminants. Even small amounts of oxygen cannot be tolerated. If oxygen is present, the plasma should have at least 99 percent, preferably 99.9 percent, bromine. The bromine can be introduced into the reactor as plasma by a method familiar to those skilled in the relevant art. For example, the bromine can be introduced by taking a bottle of bromine liquid that has a very high vapor pressure, venting the vapor into the system, and igniting a plasma using the vapor.

Referring again to FIG. 1, at the center of cathode 6 is placed a magnet such as ferrite disk magnet 26. A second magnet such as ferrite disk magnet 28 is positioned outside chamber 4, opposite magnet 26. Magnets 26, 28 thus constitute elements of a means for causing a discharge ring to arise within reactor 4, which means is an element of apparatus 2. Other means are also available, discussed, for example, in U.S. Pat. No. 4,492,610 which is hereby incorporated by reference. Magnets 26, 28 are polarized normal to the disk face and positioned with opposite field orientations. This results in a magnetic field distribution within reactor 12, indicated by curved lines or loops 30 in FIG. 1. The magnetic field of each disk magnet forms these loops 30 which leave the front face and return through the back face thereof. The field loops of each magnet are compressed by the field of the opposing magnet. Those skilled in the relevant art should appreciate that the radial component of the total field, which is zero along each disk axis, increases with radius. Accordingly, chamber 4 is bisected by an imaginary surface 32 where the total field has only a radial component. Field lines originating on the face of either magnet 26, 28 cannot cross surface 32.

An important feature of the present invention is the geometry or behavior of the field in the region 34 near the cathode/etch platform 6. The field is substantially normal to the cathode/etch platform 6 within an area surrounding the silicon wafer or other material to be etched. This area or "disc" is shown in FIG. 1 by a dashed line 36 having a certain radius. The optimum radius depends, for the most part, on the size of the wafer or etchant material. For example, it has been found that, in the illustrated apparatus, designed for 4-inch wafers, a 5-inch cathode magnet 26 would define a functional planar magnetron discharge ring. Just outside the disc formed by dashed line 36, the radial field strength increases sharply due to the fringing fields of magnet 26. The fringing fields on the periphery of magnet 26 are normal to the electric field of region 34; consequently, an intense, annular, planar "magnetron discharge" is produced.

The behavior of the field in the region 34 near cathode/etch platform 6 plays a key role in the operation of the apparatus of the present invention. The field is practically normal to cathode/etch platform 6 within a certain radius or "disc," indicated by dashed line 36. Outside the disc formed by dashed line 36, the radial field strength increases sharply due to the fringing fields of magnet 26. As the fringing fields on the periphery of magnet 26 become normal to the electric field of region 34, an intense, annular, planar "magnetron discharge" is produced. The inner diameter of this discharge can be seen in FIG. 1 to be somewhat smaller than the diameter of magnet 26.

Inside the disc 36, that is, where sample 12 would be located during operation of apparatus 2, the magnetic field is parallel to the electric field of region 34. Thus, secondary electrons emitted from the interior of cathode/etch platform 6 are magnetically focused directly through region 34 and into plasma 14. There, their trajectories follow the magnetic field lines as they bend outward toward the walls of chamber 4. Secondary electrons emitted from the center of cathode/etch platform 6 are an exception, however, as they can travel directly to the top of the plate. Visually, the discharge of the apparatus 2 of the present invention comprises a high-intensity ring close to the cathode/etch platform 6, centered on the perimeter of magnet 26, with a relatively dark interior.

From the foregoing description, those skilled in the relevant art could make and use the present invention. However, to assist those persons in understanding other aspects of the invention, certain details regarding an apparatus that has been constructed according to the present teachings and, further, certain examples involving tests performed with that apparatus are set forth below.

EXAMPLES

In accordance with the present invention, an apparatus was made comprising a reactor chamber made of aluminum, 30 cm in diameter and 10 cm in height. The diameter of the etch platform was 18.1 cm, the fused quartz plate thickness 0.16 cm, and its diameter 17.8 cm. The radio frequency power was 13.56 MHz, the nitrogen trap size was 6 inches in diameter, and the diffusion pump system was 7 inches in diameter. The base pressure, after pumping, was $1.0 \times 10^{-6}$ torr and the flow at 2 m torr (calculated from the rate of liquid $Br_2$ consumption) was 18 sccm. The radius of the sample wafer was 5 cm. Referring to the magnetic field, the magnitude of the normal field at the center of the etch platform was 150 G and the magnitude of the radial field on the etch platform above the periphery of the lower magnet was 450 G.

Samples used in the following examples (e.g., silicon, doped polysilicon, undoped polysilicon, silicon dioxide, and photoresist) were obtained commercially or fabricated by conventional IC processing techniques. High resolution patterns were defined in poly (methylmethacrylate) using a computer-controlled scanning electron microscope. Chrome etch masks were fabricated by liftoff.

All single crystal samples used in this work were 5 cm, P-doped wafers with (100) orientation. Henceforth, we shall simply refer to these as "single-crystal silicon."

A deglaze step was required to remove the native oxide on silicon prior to etching. Generally, a 30-s etch in $CBrF_3$ was used with a $-100$-V self-bias voltage at 2 m Torr. However, an exposure to a high-power ($-250$ V) $Br_2$ plasma at 2 m Torr or an HF preclean can also be used. Approximately 30 nm of silicon is etched during the $CBrF_3$ deglaze.

Etch rates and line profiles in silicon and polysilicon were determined by observing steps on patterned wafers in an SEM. $SiO_2$ and photoresist etch rates were measured by ellipsometry.

EXAMPLE 1

Reactor Characterization

Figure 2:
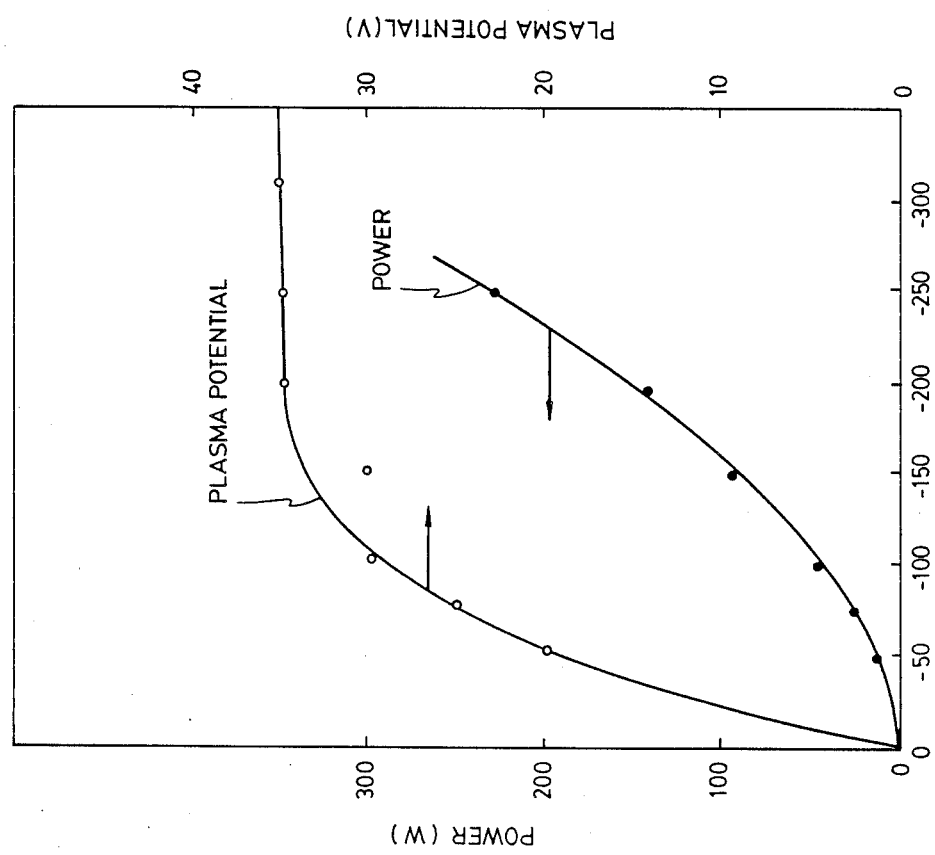
FIG. 2 shows rf power (left) and plasma potential (right) versus self-bias voltage for a bromine plasma at 2 m Torr pressure.

The dependence of power (left) and plasma potential (right) on self-bias voltage in bromine at a pressure of 2 m Torr is shown in FIG. 2. Magnetic enhancement of the plasma is manifested in the relatively low operating pressure and impedance. Without magnets, the plasma did not ignite even at 2 m Torr. At 5 m Torr, the self-bias voltage at 40 W increased from $-80$ to $-350$ V when the magnets are were removed. The plasma potential, taken as one-half of the maximum positive excursion of the cathode waveform was saturated at 35 V when the self-bias voltage reached $-200$ V. Generally speaking, this value is low enough to prevent serious sputtering of an aluminum chamber.

EXAMPLE 2

Etch Rates and Selectivity

The radial etch profile of the reactor for single-crystal silicon etching in bromine is shown in FIG. 3. These etch rates were obtained for single-crystal (100), 5 cm, P-doped silicon at a self-bias voltage of $-100$ V. The etch rate profile shows two regions: an interior disk, 10 cm in diameter, where the etch rate uniformity was better than 5%, and an outer ring where higher etch rates were obtained. The boundary between these regions marks the interior extent of the magnetron discharge ring. As power levels are increased, the magnetron discharge (which is centered on the magnet perimeter) expands, reducing somewhat the area for uniform etching. The etching results which follow all refer to wafers placed inside the disc of uniform etching.

Figure 4:
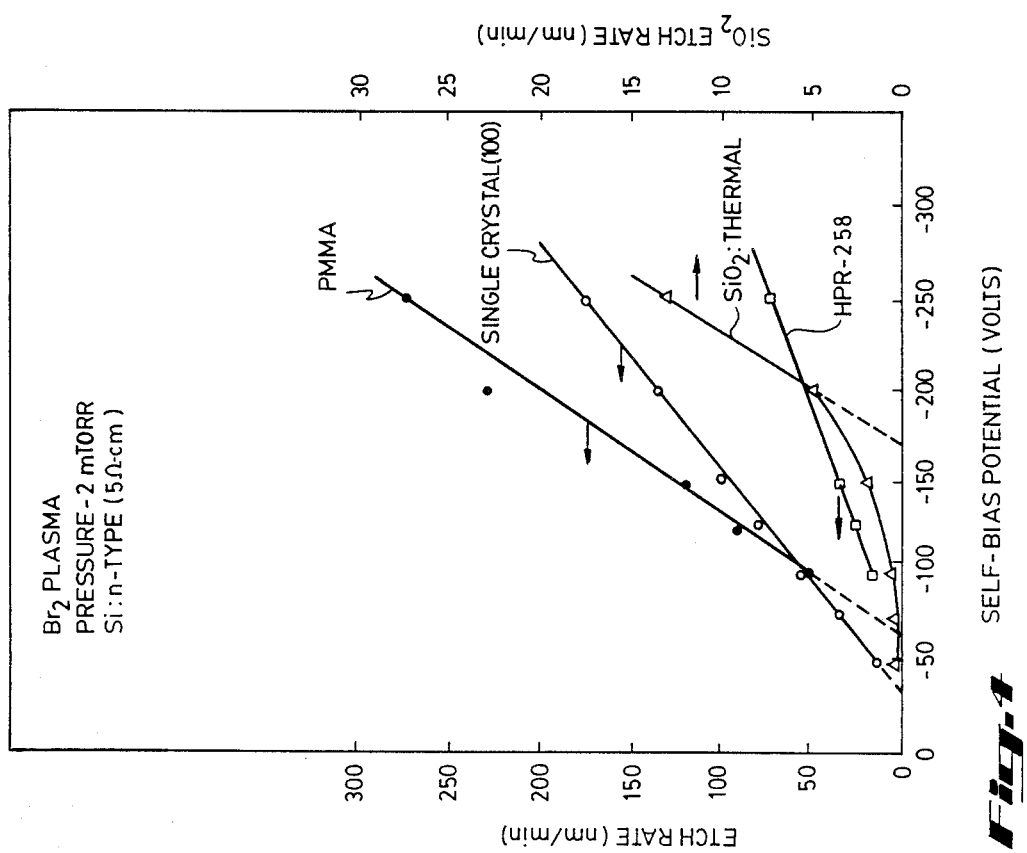
FIG. 4 shows etch rates of 5 Ω cm, P-doped, single-crystal (100) silicon, HPR-256 photoresist, and PMMA (all left scale) and thermal silicon dioxide (right scale) versus self-bias voltage at 2 m Torr pressure in a bromine plasma.

FIG. 4 shows the etch rates of single-crystal silicon, HPR-256 photoresist, PMMA, and thermal $SiO_2$ versus self-bias voltage. The right axis refers to $SiO_2$. The left axis refers to the other materials. The etch rate curves contain a linear segment at high bias values which, when extrapolated to the voltage axis, defines the "effective threshold" for the etch process. This threshold behavior involves more than the energy threshold in the sputtering yield, because ion current and radical concentration, which are strongly dependent upon the self-bias voltage, also play a role. The effective etch thresholds for silicon and silicon dioxide are −35 to −175 V, respectively.

Figure 5:
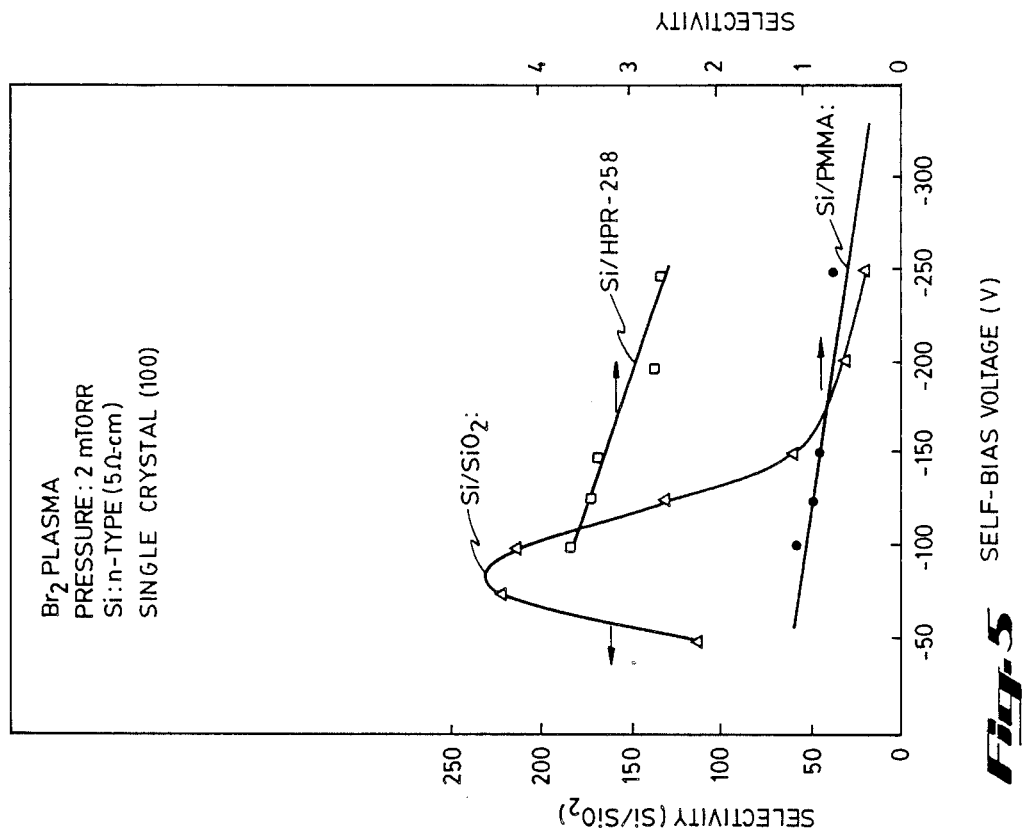
FIG. 5 shows selectivity of 5 Ω cm, P-doped, single-crystal (100) silicon with respect to HPR-256 photoresist and PMMA (both right scale) and with respect to thermal oxide (left scale) versus self-bias voltage at 2 m Torr pressure in a bromine plasma.

FIG. 5 shows the selectivity of silicon with respect to $SiO_2$ (left-hand scale), and with respect to PMMA and HPR-256 (right-hand scale). The large etch threshold of $SiO_2$ relative to Si results in the selectivity maximum (225) at −100 V. The reduction in selectivity at lower voltages reflects the lower silicon etch rates as the silicon threshold is approached. The sharp reduction in selectivity for oxide at higher voltages implies a practical tradeoff between throughput and selectivity. Selectivity with respect to photoresist and PMMA is acceptable for most applications.

Figure 6:
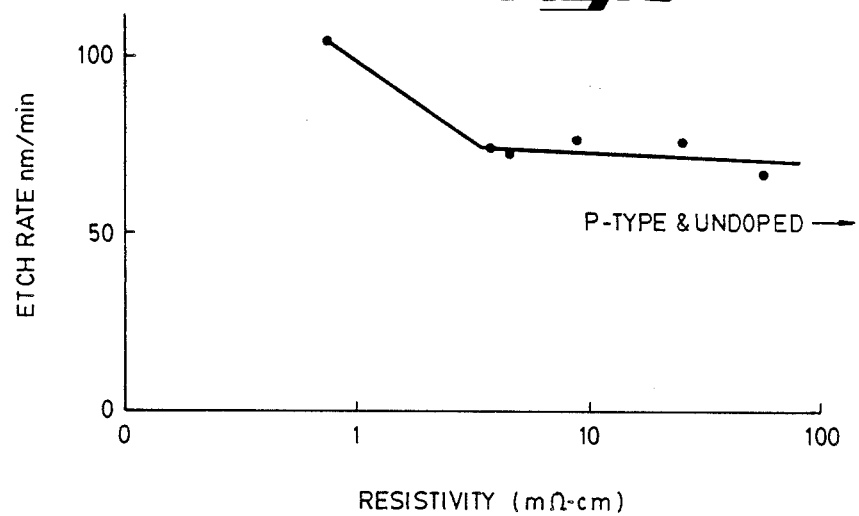
FIG. 6 shows etch rate of P-doped polysilicon versus resistivity at −100 V bias in a bromine plasma at 2 m Torr.

The effect of resistivity on the etch rate of polysilicon is shown in FIG. 6. Etch rate was shown to increase gradually from 55 nm/min for p-type and undoped poly to 105 nm/min for 0.8 m cm, P-doped material. This resistivity corresponded to a concentration greater than $2 \times 10^{21}/cm^3$. Note that the maximum selectivity for oxide was 450 for this particular n+ polysilicon.

EXAMPLE 3

Trench Profiles

The following patterning sequence was performed. First, a wafer was thermally oxidized to a thickness of 20 nm. A 20-nm-thick chrome mask was then formed by electron-beam (e-beam) lithograph and liftoff. A chrome pattern was subsequently transferred to the oxide by etching for 3 min in a $CF_3Br$ plasma at 2 m Torr pressure and −100 V self-bias voltage. The gas was then changed to $Br_2$ without opening the system and etching continued for an additional 50 min at 100 V. A portion of the mask pattern consisted of 0.2-$\mu$-wide lines with 0.6-$\mu$ spaces. Spaces 0.1-$\mu$ wide and 0.04-$\mu$ wide were obtained. Etch profiles exhibited a 4° overcut taper which could be straightened by overetching. In trench etching applications this resulted in profiles which were straight for the top 20% of the trench depth and tapered toward the bottom. The effects of ion scattering between facing trench walls were only seen for widths below 0.2-$\mu$. The side-wall taper disappeared and random deviations from vertical appeared as etching proceeded.

EXAMPLE 7

Polysilicon Gate Structures and Loading Effect

Some n-type metal-oxide semiconductor (n-mos) gate structures were fabricated in 0.8 m cm, P-doped polysilicon 0.45 $\mu$ thick on 10-nm-thick thermal oxide. Two different masks were used: (1) a chrome mask to verify that the oxide could withstand severe overetching and that anisotropy is not due to redeposited photoresist; and (2) a PMMA mask to demonstrate a practical 0.25-$\mu$ gate process using direct write e-beam lithography.

In one etching process, a sample was etched for 14 minutes in $Br_2$ at −100 V following an initial, 30-s, −250 V Br deglaze. This etch time corresponded to a 200% overetch of the polysilicon. A chrome-masked grating with 0.2-$\mu$-wide lines and spaces—and with no mask undercutting or oxide penetration—was produced.

In another etching process, the −100-V $Br_2$ process was again used. However, a −100-V, 30 $CF_3Br$ deglaze was used. Partial etching of a n+ -polysilicon surface resulted in a very clean final product. Silicon etch rates with the etch platform, including the magnetron, covered with silicon were found to be comparable to those on a base $SiO_2$ plate.

EXAMPLE 5

Bromine etching of single-crystal and polycrystalline silicon at 2 m Torr pressure was shown to be exceptionally anisotropic and selective with respect to oxide and photoresist. Loading effects were absent. A low-voltage (−100 V) process, optimized for selectively to oxide, was applied to the fabrication of polysilicon gate structures and high aspect ratio trenches. The gate etch process was shown to have 0.25-$\mu$m resolution, using an e-beam defined PMMA mask. The selectivity of polysilicon with respect to PMMA and $SiO_2$ was sufficiently high as not to require endpoint detection for polysilicon thicknesses up to 0.5 $\mu$, even on sub-10-nm-thick gate oxides. Oxide breakdown was prevented by the low bias voltage. The trench process required only a 20-nm-thick oxide mask to etch 3 $\mu$ of silicon. Edge profiles showed a slight overcut taper (4°) which straightened with overetching. Trenches below 0.2 $\mu$ wide showed the effects of wall-to-wall ion scattering. The taper was absent and random waviness appeared for depths greater than 1 $\mu$. Throughput for the trench process was quite low, but could have been increased at a sacrifice in selectivity.

Figure 7:
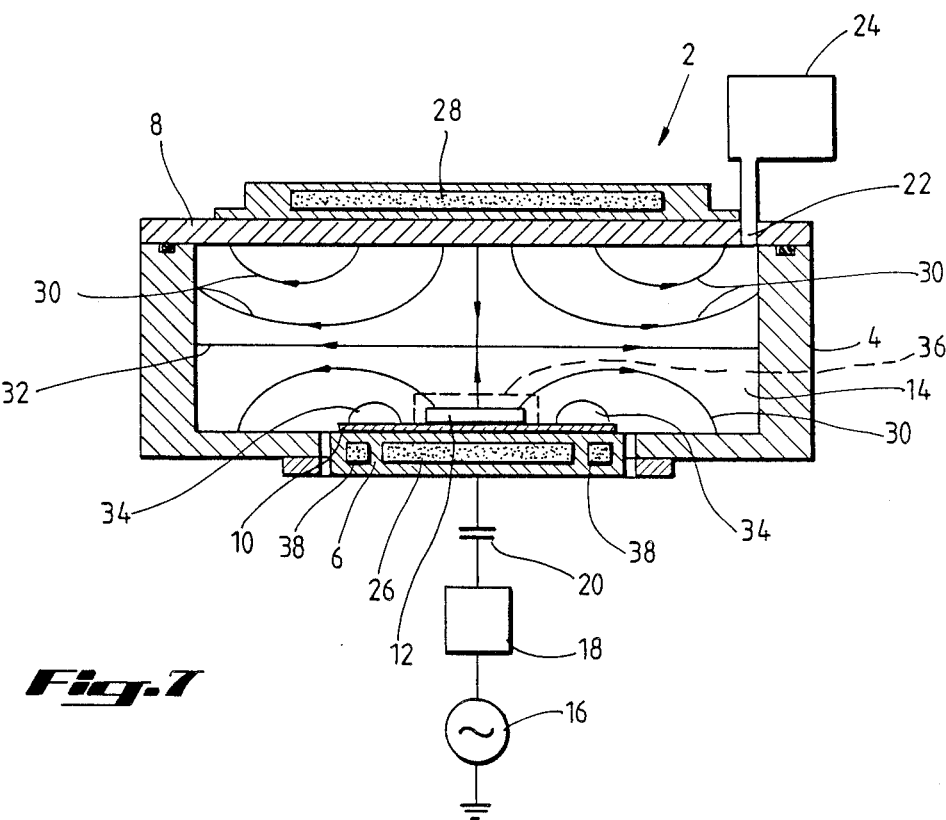
FIG. 7 is an schematic view of an alternative apparatus according to the present invention.

It will be apparent, of course, that many modifications may be made in the above-described embodiments without departing from the scope of the invention, which is defined by the claims below. For example, referring to FIG. 7, a second cathode magnet 38 in the form of a ring may be installed surrounding magnet 26. This ring magnet 38 is preferably polarized normal to its face and installed with opposite polarity to magnet 26. The impedance of such a system may be varied by controlling the spacing between magnet 26 and magnet 30 or alternatively, by varying the magnetic fields of the magnets in the system. It should be understood, therefore, that within the scope of the appended claims, the invention may be practiced otherwise than as specifically described.

What is claimed is:

1. An etching process comprising the steps of:
   supplying power between an anode and a cathode;
   generating a molecular bromine plasma within a reaction chamber;
   placing silicon to be etched in the vicinity of said cathode;

producing a discharge ring of a planar magnetron around the silicon; and etching said silicon by ions attracted from said plasma toward said cathode.

2. The process of claim 1 in which said bromine plasma is maintained at about 2 m Torr pressure during etching.

3. The process of claim 2 in which power is supplied between said anode and said cathode so that said cathode bias is from about −85-V to about −105-V.

4. The process of claim 3 in which power is supplied between said anode and cathode so that said cathode bias is about −90-V.

5. An apparatus for etching a substrate, comprising:
a reaction chamber for enclosing the substrate;
means for generating a plasma in said reaction chamber;
means for supporting said substrate in said reaction chamber at a supporting area;
a cathode; and
means for magnetically enhancing said plasma to generate a ring-shaped planar magnetron discharge at said cathode, wherein said discharge is larger in diameter than said supporting area.

6. The apparatus of claim 5 additionally comprising said substrate, wherein said substrate is a silicon wafer.

7. The apparatus of claim 5 additionally comprising an anode which is disposed opposite said cathode.

8. The apparatus of claim 5 wherein said means for magnetically enhancing said reaction chamber comprises a first magnet disposed at said cathode.

9. The apparatus of claim 8 additionally comprising a second magnet disposed at said anode.

10. The apparatus of claim 5 wherein said means for magnetically enhancing said reaction chamber comprises at least two magnets disposed on opposite sides of said substrate.

11. A method for processing a substrate, comprising placing the substrate in the interior of the discharge ring of a planar magnetron so that the ring surrounds said substrate.

12. An etching method comprising the steps of:
supplying power between an anode and a cathode;
generating a plasma within a reaction chamber;
placing a substrate to be etched in the vicinity of said cathode;
producing a discharge ring of a planar magnetron around the substrate; and
etching said silicon by ions attracted from said plasma toward said cathode.

13. An etching method comprising the steps of generating a plasma comprising molecular bromine; generating a ring-shaped magnetron discharge; and etching a substrate with ions in said plasma.

14. A magnetically enhanced apparatus for etching a substrate, said apparatus comprising: a chamber for enclosing said substrate; means for supporting said substrate; means for etching said substrate which comprises a reactive etchant gas consisting essentially of molecular bromine; and means for generating a ring-shaped planer magnetron discharge.

15. An apparatus for etching a substrate, said apparatus comprising: a chamber for enclosing said substrate; means for supporting said substrate; means for etching said substrate which comprises a reactive etchant gas comprising at least 90 percent molecular bromine; and means for generating a magnetron discharge that surrounds said substrate.

16. The apparatus of claim 14 wherein said apparatus is a magnetically enhanced RIE apparatus.

17. The apparatus of claim 15 wherein said magnetron discharge is ring-shaped.

18. The apparatus of claim 14 additionally comprising said substrate and a ring-shaped magnetron discharge surrounding said substrate.

19. The apparatus of claim 18 wherein said substrate is a silicon wafer.

20. The apparatus of claim 19 additionally comprising a magnetron discharge, wherein said magnetron discharge surrounds said silicon wafer.

21. The apparatus of claim 14 additionally comprising means for introducing said etchant gas to said apparatus.

22. The apparatus of claim 14 additionally comprising a magnetically enhanced cathode.

23. The apparatus of claim 14 wherein said magnetic enhancement is provided by a magnet disposed at said cathode to provide a ring-shaped discharge.

24. An apparatus for etching a substrate, said apparatus comprising a chamber for enclosing said substrate; means for supporting said substrate; and means for etching said substrate, said etching means having a silicon selectively measured with respect to silicon dioxide of at least 25.

25. The apparatus of claim 24, wherein said etching means has a silicon selectivity with respect to silicon dioxide of at least 50.

26. The apparatus of claim 24, wherein said etching means has a silicon selectivity with respect to silicon dioxide of at least 100.

27. An apparatus for etching a substrate, said apparatus comprising a chamber for enclosing said substrate, means for supporting said substrate, and means for etching said substrate, said etching means having an etch rate on a single-crystal silicon wafer of at least 50 nanometers per minute when said apparatus is operated at a voltage of from about −85 V to about −105 V.

28. The apparatus of claim 27, wherein said etching means has an etch rate on said wafer of at least about 50 nanometers per minute when said apparatus is operated at a voltage of less than about −100 V.

29. The apparatus of claim 27, wherein said etching means has an etch rate on said wafer of at least about 100 nanometers per minute.

30. The apparatus of claim 27 wherein said etch means comprises a reactive etchant gas comprising molecular bromine.

31. The apparatus of claim 27 wherein the apparatus is magnetically enhanced.

32. A method of etching a substrate comprising the steps of: enclosing and supporting said substrate within a chamber; and etching said substrate at an etch rate sufficient to provide a selectivity for a silicon substrate of at least 25 when measured with respect to the etch rate on a silicon dioxide substrate.

33. The method of claim 32 wherein said substrate is etched at an etch rate sufficient to provide a selectivity for a silicon substrate of at least 50 when measured with respect to the etch rate on a silicon dioxide substrate.

34. The method of claim 33 wherein said substrate is etched at an etch rate sufficient to provide a selectivity for a silicon substrate of at least 100 when measured with respect to the etch rate on a silicon dioxide substrate.

35. A method of etching a substrate, said method comprising the steps of: enclosing a substrate, placing said substrate between an anode and a cathode, providing a voltage from about −85 V to about −105 V across said anode and cathode, and etching said substrate at a rate of at least 50 nanometers per minute.

36. The method of claim 35 wherein the substrate comprises silicon.

37. The method of claim 35 wherein the substrate is etched at a rate of at least 100 nanometers per minute.

38. The method of claim 35 wherein said voltage is less than −100 V.

39. The method of claim 35 additionally comprising generating a plasma within said chamber that comprises molecular bromine.

40. The method of claim 35 additionally comprising generating a planar magnetron discharge to said substrate.

41. The method of claim 40 wherein said planar magnetron discharge is ring-shaped.

42. The method of claim 40 wherein said planar magnetron discharge surrounds said substrate.

* * * * *